US006689494B1

(12) United States Patent
Karandikar

(10) Patent No.: US 6,689,494 B1
(45) Date of Patent: Feb. 10, 2004

(54) LIGHT EMISSIVE MATERIALS FOR ORGANIC LIGHT EMITTING DEVICES (OLED) AND OLED BASED THEREUPON

(75) Inventor: Bhalchandra M. Karandikar, 11844 SW. Morning Hill Dr., Tigard, OR (US) 97223

(73) Assignee: Bhalchandra M. Karandikar, Tigard, OR (US)

(*) Notice: Subject to any disclaimer, the term of this patent is extended or adjusted under 35 U.S.C. 154(b) by 0 days.

(21) Appl. No.: 10/241,351

(22) Filed: Sep. 11, 2002

(65) Prior Publication Data (65)

Related U.S. Application Data

(60) Provisional application No. 60/322,102, filed on Sep. 11, 2001.

(51) Int. Cl.[7] .............................................. H05B 33/14
(52) U.S. Cl. ..................... 428/690; 428/917; 428/704; 313/504; 313/506; 257/40; 257/103; 252/301.16; 252/301.26; 252/301.21; 252/301.31; 252/301.32; 546/13; 548/6; 548/110
(58) Field of Search ........................ 428/690, 917, 428/704; 313/504, 506; 257/40, 103; 252/301.16, 301.26, 301.32, 301.21, 301.31; 546/13; 548/6, 110

(56) References Cited

U.S. PATENT DOCUMENTS

| 4,539,507 | A | 9/1985 | VanSlyke |
| 5,294,870 | A | 3/1994 | Tang |
| 5,674,635 | A | 10/1997 | Hsieh |
| 5,852,191 | A | 12/1998 | Karandikar |
| 6,121,727 | A | 9/2000 | Kanai |
| 6,287,713 | B1 | 9/2001 | Heuer |
| 6,312,835 | B1 | 11/2001 | Wang |
| 6,368,731 | B1 | 4/2002 | Heuer |
| 6,391,482 | B1 | 5/2002 | Matsuo |

FOREIGN PATENT DOCUMENTS

| JP | 1997 289.081 A1 | 11/1997 |
| JP | 2001 294851 A1 | 10/2001 |

OTHER PUBLICATIONS

Sturmer, Special Topics in Heterocyclic Chem., Weissburger & Taylor, Eds., Ch. VIII, John Wiley and Sons, New York (1977) p 512–515 No month.
Forrest et. al., "Organic Emitters Promise a New Generation of Displays", Laser Focus World, pp 99–107, Feb. 1995.
Wang, Y., "Photo Conductive Polymers", Kirk–Otherer Encyclo. of Chemical Technology, 4th Edn, John Wiley and Sons, vol. 18, pp. 840–841 (1996) No month.
Daub et. al., Polymer Preprints., vol. 38, No. 1, p 339–340 (1997) No month.
Kafafi et. al., Polym. Preprints., vol. 38, No. 1, pp. 390–391 (1997) No month.
Wang, Q. et. al., Polym. Preprints., vol. 40, No. 2, pp. 1248–1249 (1999) No month.
Djurovich et.al., Polym. Preprints., vol. 41, No. 1, pp. 770–771 (2000) No month.

Primary Examiner—Deborah Jones
Assistant Examiner—Ling Xu

(57) ABSTRACT

Organic light emitting device (OLED) assemblies having light emitting layers made from boron atom rigidized monomethine cyanines are disclosed. OLED assemblies are constructed by conventional vapor deposition technique as well as by solution spin coating method. The OLED assemblies disclosed are expected to emit blue light and have improved color saturation because of smaller spectral width of the light emissive materials used.

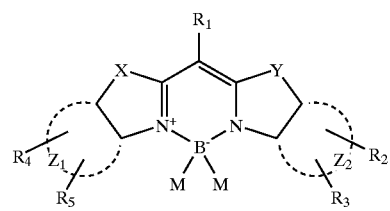

2 Claims, 5 Drawing Sheets

(Not to scale)

(Not to scale)

(Not to scale)

(Not to scale)

LIGHT EMISSIVE MATERIALS FOR ORGANIC LIGHT EMITTING DEVICES (OLED) AND OLED BASED THEREUPON

RELATED APPLICATIONS

This application claims the benefit of U.S. Provisional Application No. 60/322,102, filed Sep. 11, 2001.

FIELD OF THE INVENTION

The invention is in the field of emissive materials for display applications. More specifically, it pertains to the use of organic luminescent materials in light emitting devices.

BACKGROUND OF THE INVENTION

Organic light emitting devices (OLED) are an attractive alternative to current display technologies such as plasma based displays and vacuum fluorescence because they offer advantages of low cost, likely ease of manufacture, large area, wide viewing angle and open up the possibility of flexible displays. Flexible displays can have host of consumer applications. In a typical organic light emitting device, light is given off when electrons and holes recombine after they are transported into the light emission layer.

Depending upon the properties of the light emissive material making up the light emission layer, devices can emit a given color in the visible range of the electromagnetic spectrum. For example, one can create devices emitting red, green or blue color (RGB). Some of the devices already described in the published literature have used known luminescent compounds as light emissive materials. For example, U.S. Pat. No. 5,674,635 describes the use of Coumarin-6, a known fluorescent dye as emitter material for green light in an OLED.

One of the problems faced in OLEDs for RGB displays, is that the color saturation or purity is not very satisfactory due to a large spectral width of the each color component (Forrest et. al., Laser Focus World, pp. 104, February 1995). Usually, the large spectral width of electroluminescent (EL) spectrum is inherent of the starting luminescent material because EL spectrum generally matches photoluminescence (PL) spectrum. Therefore, choosing, the light emissive material having smaller PL emission spectral width is one approach to solving the color purity problem.

Unfortunately, organic luminescent materials such as coumarins, pyrazoles, pyrazolines etc., possess broad PL spectrum rendering their color saturation less than desirable. Cyanines are a class of organic compounds that possess sharp absorption and emission spectra. More specifically, cyanines that exhibit higher fluorescent quantum efficiencies due to their rigid structures are desirable. U.S. Pat. No. 5,294,870 discusses the use of trimethine and pentamethine cyanine dyes for emitting green and red colors and of other cyanine dyes covered by Weissberger and Taylor, Special Topics of Heterocyclic Chemistry, John Wiley and Sons, New York, 1977, Chapter III" for use in OLED assemblies. However, rigidized dyes structures shown in Chapter VIII are rigidized by carbon atoms and do not mention any other rigidizing atoms. Moreover, the cyanines dyes structures suggested by U.S. Pat. No. 5,294,870 and the references therein contain counterions.

Monomethine cyanines (those with one carbon atom in the chromophoric linkage) based on pyrrole heterocycle and rigidized by boron atom was used as a dopant in HTL and ETL in constructing EL device (Chem. Abs., Vol. 127:364033s) and subsequently structural variations of the same basic chromophore were incorporated in EL devices (Polym. Prep., Vol. 38(1), pp390, 1997 and Polym. Prep. Vol.38(1), pp.339, 1997). However, the use of this boron rigidized pyrrole based monomethine cyanine dye in EL devices reported is limited to generating light in green or red region of visible light spectrum. The dye structure simply does not permit its use in EL device for creating blue light. So there is a need for emitter materials suitable for generating blue color of sufficient color purity in an OLED.

Recently, some rigidized cyanines were patented (U.S. Pat. No. 5,852,191) as new chemical compounds for use in fluorescent labeling, as textile and laser dyes. Unlike the monomethine cyanines suggested by U.S. Pat. No. 5,294,870 these compounds are devoid of counterions so structurally quite distinct from traditional cyanine dyes. These dyes are efficient luminophors (efficiency 0.9), possess good light fastness, sharp absorption and emission spectra. However, the rigidized cyanines described in U.S. Pat. No. 5,852,191 have not been proposed for application as light emissive materials for OLEDs.

SUMMARY OF THE INVENTION

In one aspect the invention is directed to the method of using the rigidized cyanines of U.S. Pat. No. 5,852,191 as emissive materials in an organic light emitting device (OLED) assembly. It is further the object of the invention to feature an OLED assembly emitting blue light. It is further the object of the invention to feature an OLED assembly emitting blue light in which the emissive material is deposited as a layer using conventional small molecule deposition technique such as thermal vacuum deposition. It is further an object of the invention to feature OLED assembly in which the emissive material is dispersed as a dopant in the hole transport layer or an electron transport layer. Co-deposition of emissive material with the hole transport material or an electron transport material can be achieved by thermal vacuum deposition. Another way to achieve doping of the emissive material is by dissolution in a suitable solvent along with an electron transport material and a polymeric hole transport material. It is further the object of the invention to feature OLED assembly having emissive material as a layer or as a dopant to emit light covering the 500 nm–700 nm region of the visible spectrum.

DESCRIPTION OF THE PREFERRED EMBODIMENTS

Figure 1:
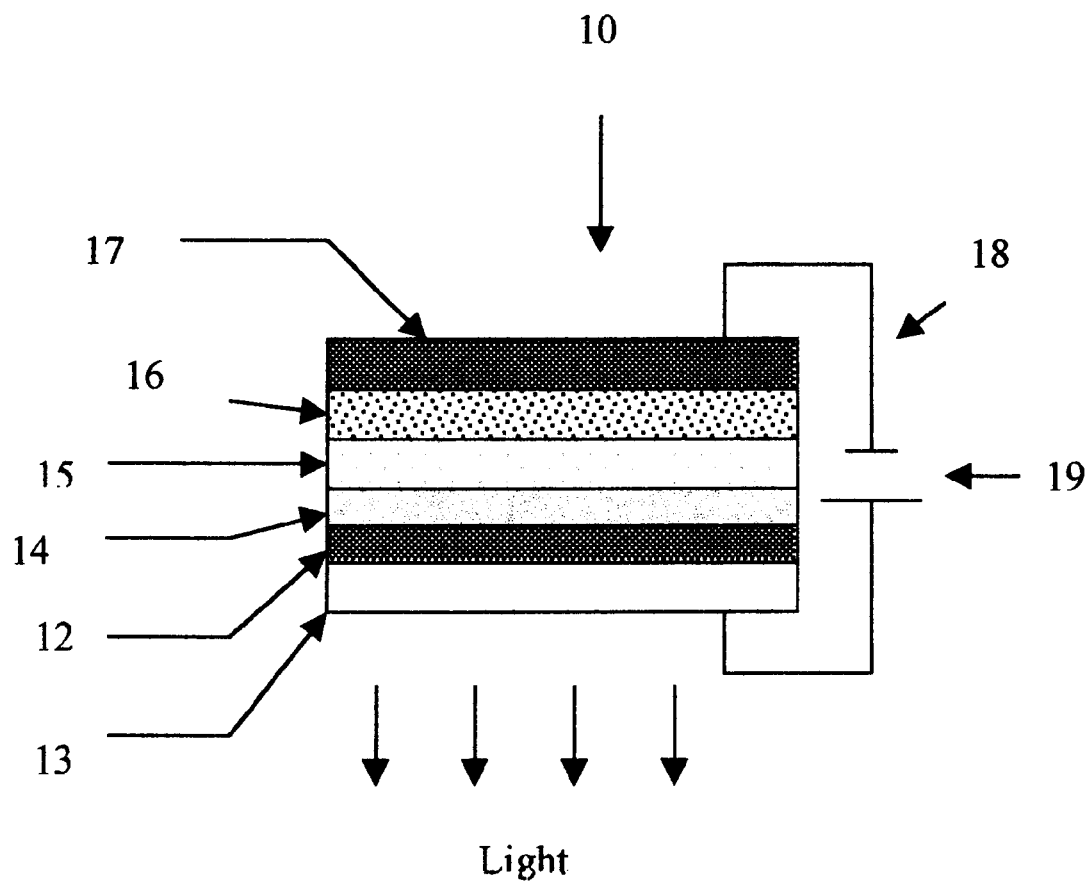
FIG. 1 is a schematic sectional view of an organic light emitting device (OLED) assembly of the present invention shown connected to a power source. The assembly shown is a three organic layer assembly formed using vapor deposition technique.

This invention is described in detail herein in connection with embodiments wherein in the organic materials in an EL device are stacked in layers between a pair of electrodes. Organic layers can vary between one and three. More than three layers are possible when a hole injection enhancement layer is sandwiched between anode and hole transport layer. Likewise, an electron injection enhancement layer is placed adjacent to cathode.

The EL devices of the present invention are of types wherein total number of organic layers are either one, two or three.

In a single organic layer EL device, the layer is preferably spin coated on to the anode. The solution used in spin coating consists of a hole transport compound as polymer, electron transport compound and emissive material as dopants dissolved in a suitable solvent. Chlorinated solvents such as chloroform, methylene chloride etc. are suitable for use with poly (N-vinyl carbazole) as hole transport compound. The anode comprises of a thin layer of ITO on glass. Though material such as quartz can also be used in place of glass. Flexible material such as a polymer film can also be a support for ITO anode layer. Upon removal of solvent, a thin organic layer consisting of hole transport material as the bulk polymer doped with electron transport compound and emissive material is left on the anode. Cathode in form of a thin film is finally evaporated on to the spin coated film to complete the device.

The two or three organic layer EL devices of the present invention are preferably prepared using small molecule deposition technique such as thermal vacuum deposition. In the two layer EL device, the hole transport material, usually a tertiary aromatic amine is vacuum deposited on anode i.e. ITO on glass. Hole transport materials used in general are transparent to emitted light of EL device. The second organic layer comprises of an emissive material that also functions as electron transport material. The boron atom rigidized cyanines are highly electron deficient compounds and therefore possess fair electron transport ability. Finally, a metal layer is evaporated on top the second layer to complete the assembly.

In a three organic layer device, first layer deposited is a hole transport material, then emissive material is deposited, followed by a layer an electron transport material and a metal layer as cathode.

ITO on glass is preferred as anode, though ITO on quartz may also be used if higher transmission of light is desired. For making flexible device, ITO may be deposited on a flexible polymer film such as polycarbonate or PET. The surface resistance of ITO on glass is typically 10 to 50 ohms/square. Preferred value is about 20 ohms/square. The surface of the anode should be clean and smooth and it is desirable that it may be further smoothed by conventional lapping techniques.

Among hole transport compounds, well known are tertiary aromatic amines. Several such structures are disclosed on p. 840–841 in Volume 18, Kirk-Othmer Encyclopedia of Chemical Technology 4$^{th}$ Edition, John Wiley and Sons (1996) and incorporated herein by reference. Preferred hole transport compound of the present invention is N,N'-diphenyl-N,N'-bis[3methylphenyl]-[1,1'-biphenyl]-4,4'-diamine. In general, the hole transport layer should be fairly transparent to 400 nm or higher wavelengths and therefore is preferably colorless.

The emissive materials making up the emissive layer in an EL device of this invention are boron rigidized monomethine cyanines having a structure:

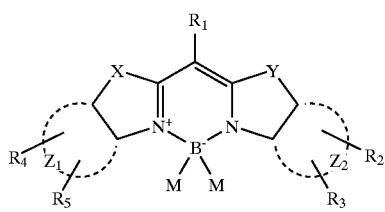

wherein:
X and Y are selected from the group consisting of —C(CH$_3$)$_2$—, oxygen, sulfur, —CH═CH—, and N—W—K where N is nitrogen;

dotted lines Z$_1$, and Z$_2$ represent the atoms necessary to complete a structure selected from the group consisting of one ring, two fused rings and three fused rings, each said ring having five or six atoms and each said ring comprising carbon atoms and, optionally no more than two atoms selected from oxygen, nitrogen and sulfur;

R$_1$, R$_2$, R$_3$, R$_4$, R$_5$ are selected from the group consisting of —K and —W—K M is selected from the group consisting of F and Cl;

B is Boron;

W is a linker selected from the group consisting of branched alkyl chains of 1–27 carbon atoms, straight alkyl chains of 1–27 carbon atoms, monoethers containing 2–20 carbon atoms and polyethers containing 2–20 carbon atoms; and K is a group conferring desired properties and is selected from the group consisting of:
neutral groups that reduce water solubility selected from the group consisting of hydrogen and halogen atoms;
polar groups that increase water solubility selected from the group consisting of amide, sulfonate, sulfate, phosphate, quaternary ammonium, hydroxyl and phosphonate;
functional groups selected from the group consisting of amino, hydroxyl, sulfhydryl, carboxyl, carbonyl;
reactive groups selected from the group consisting of succinimidyl ester, isothiocyanate, isocyanate, iodoacetamide, maleimide, sulfonyl halide, phosphoramidite, alkylimidate, arylimidate, acid halide, substituted hydrazines, substituted hydroxylamines, carbodiimides; and
electron donating and withdrawing groups that shift absorption and emission wavelengths of the fluorescent molecule;
selected from the group consisting of cyano, nitro, fluoromethyl, amide, nitrophenyl, sulfonamide, alkenyl and alkynyl;

The emissive material in the EL device of the present invention may in the form of a dopant in the single organic layer device. Preferred form is to have the emissive material as a dopant in quantity ≦2.5% in the spin coated layer. Emissive material of type shown here with quinoline as a heterocycle is expected to generate green light in an OLED assembly.

The hole transport materials used in the EL device of the present invention are pi electron deficient heterocyclic compounds such as oxadiazoles, triazoles, triazines, quinoxalines. Preferred compound is a 2-(4-biphenyl)-5-(4-tert-butylphenyl)-1,3,4-oxadiazole. The electron transport compounds preferably should form amorphous thin pin hole free films.

Useful examples of cathode materials suitable for deposition by thermal vacuum deposition include Indium, Aluminium, Magnesium, Silver, Gold and Cathode. When reactive metals such as Calcium or Magnesium are used, they need to be protected from air by deposition of a protective layer of Silver or Aluminium. Preferred metals for use a cathode are those with low work function such Magnesium or Calcium. While it is important that the anode material be transparent to light $\geq 400$ nm, it is inconsequential with respect to cathodic material.

FIG. 1 shows an OLED assembly 10 constructed in accordance with the present invention. It comprises of anode electrode 12 comprising of a semitransparent ITO coating on a glass or quartz support 13. A hole injecting or transporting layer 14 is stacked on top of the ITO coating. A layer comprising of light emitting material 15 is disposed on layer 14. A third layer 16 comprising of an electron transport material is laid atop layer 15. Finally, a cathode 17 in form of a thin metallic film is disposed on layer 16. The electrodes 12 and 17 are connected to power source 19 using lead wires 18. When the power source 19 is turned on, holes are injected from anode 12 into hole transport layer and they then combine in light emissive layer 15 with electrons that travel from the cathode 17 generating visible light.

Figure 2:
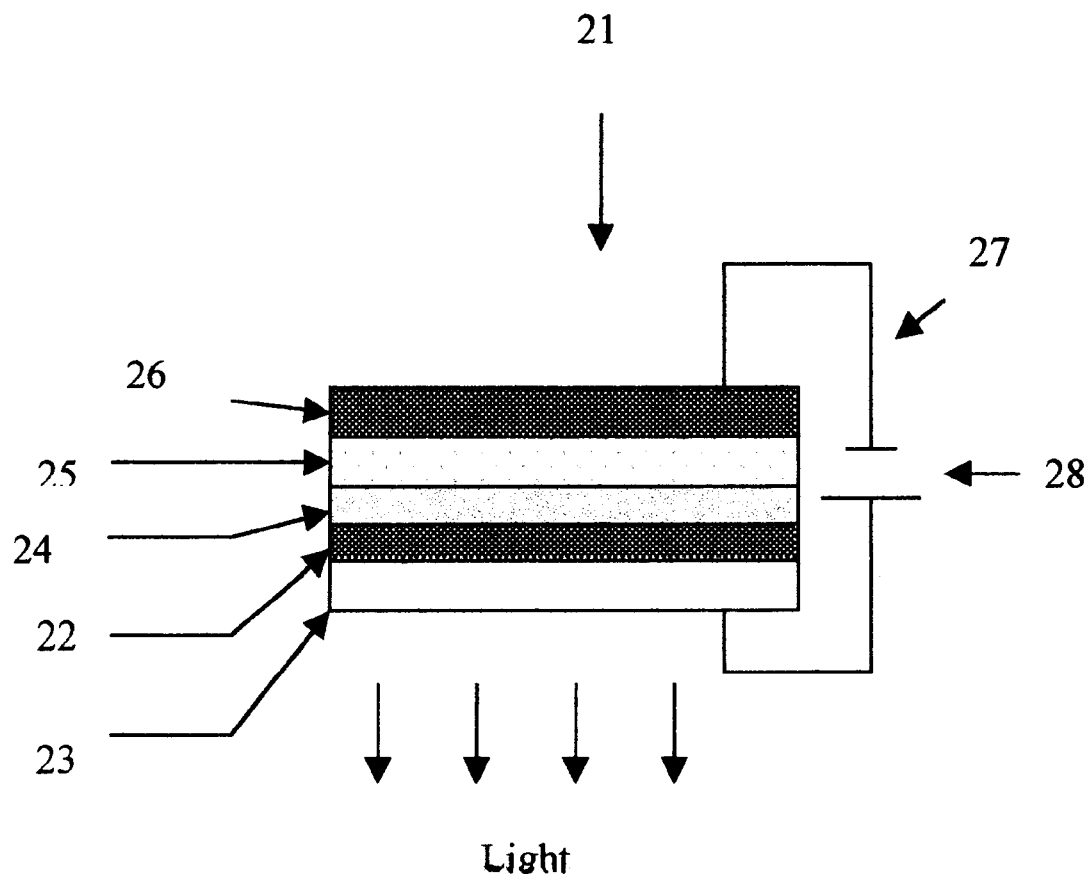
FIG. 2 is a schematic sectional view of an OLED assembly of present invention connected to power source. The assembly is a two organic layer assembly in which at least one layer is deposited using evaporative method.

FIG. 2 shows another OLED assembly 21 constructed according to present invention. It comprises of an anode electrode 22 comprising of a semitransparent ITO coating on a glass or a quartz support 23. A layer of hole injecting or transporting material 24 is laid adjacent to the electrode 22. On top of layer 24 is stacked a layer of light emissive material 25 that also functions as electron transport layer. A cathode 26 is laid on top of layer 25. Using pair of lead wires 27 the power source 28 is connected to respective electrodes. Upon turning on power, the holes generated at anode travel through layer 24 and electrons generated at cathode move through layer 25. The holes and electrons combine near the interface of layers 24 and 25 resulting in visible light.

Figure 3:
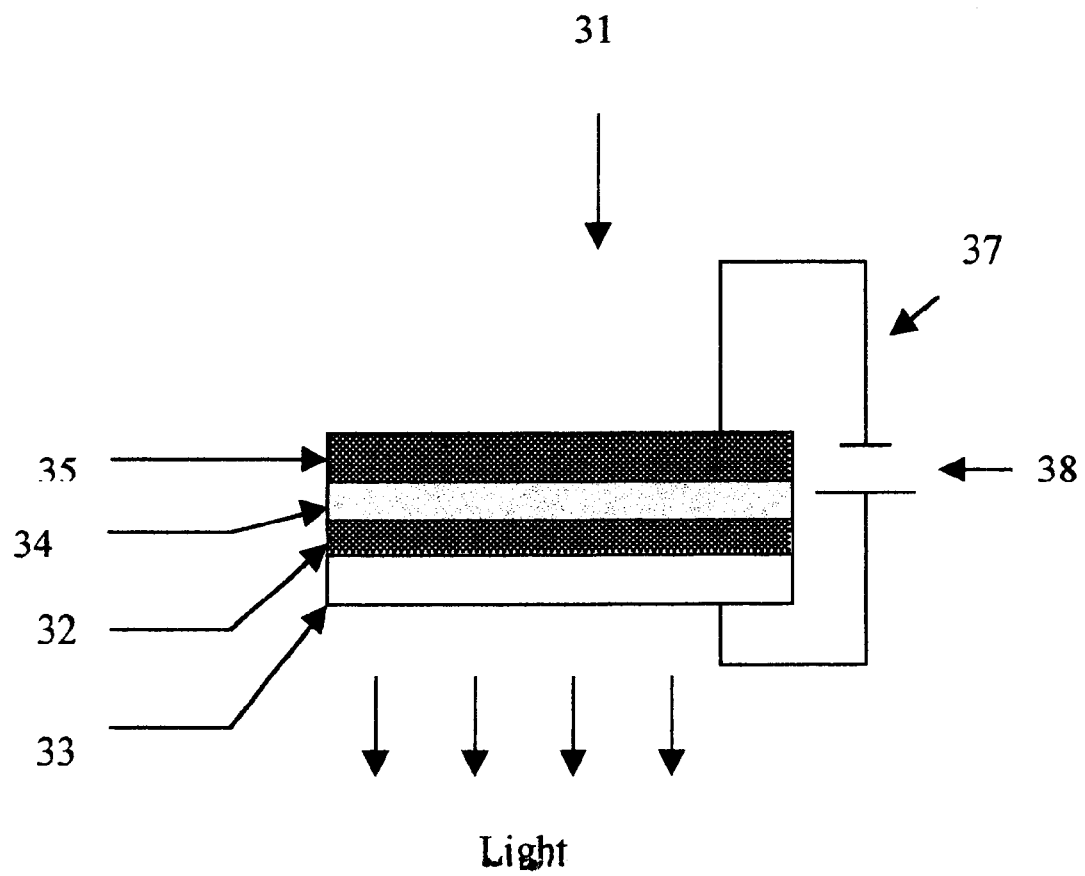
FIG. 3 is a schematic sectional view of an OLED assembly of present invention having a single organic layer. This layer is spin coated with emitting material present as a dopant.

FIG. 3 shows another OLED assembly 31 constructed according to present invention. It comprises of an anode electrode 32 comprising of a semitransparent ITO coating on a glass or a quartz support 33 and a cathode 35 that sandwich a organic layer 34. The organic layer 34 comprises of a hole injecting and transporting polymer wherein are dispersed the electron transport material and a luminescent material. The dispersed electron transport material in layer 34 facilitates electron transport. The electrodes 32 and 35 are connected to power source 38 with a pair of lead wires 37. When power source 38 is turned on, the mobile holes and electrons travel through and combine in layer 34 generating visible light.

EXAMPLES

The following examples further illustrate the invention i.e. the construction of an OLED based on boron atom rigidized monomethine cyanines as emissive materials. The examples describe the construction of OLED assemblies having one, two or three organic layers.

Example 1

The emissive material, bisbenzothiazole based rigid cyanine dye was synthesized according to the procedure described in Example A of U.S. Pat. No. 5,852,191 and incorporated herein by reference. The dye was obtained as yellow crystals and characterized by elemental analysis, NMR, UV/VIS and PL spectra. The structure of the compound is shown below.

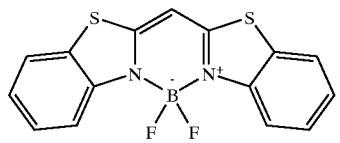

Example 2

The emissive material, bisbenzoxazole based rigid cyanine dye was synthesized according to the procedure described in Example B of U.S. Pat. No. 5,852,191 and incorporated herein by reference. The dye was obtained as white crystals and characterized by elemental analysis, NMR, UV/VIS and PL spectra. The chemical structure of the resulting compound is shown below.

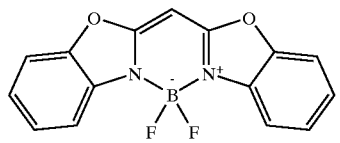

Example 3

An OLED assembly similar to that of FIG. 1 is prepared as follows:

A 2"×2" ITO on glass piece is cleaned by squirting isopropyl alcohol and then acetone with the help of squeeze bottle. The piece is washed with cold water for several minutes by holding the piece under running water. The piece is placed in a beaker containing 15% v/v aqueous ammonium hydroxide heated to 65C–70C and ultrasonicated for 10–15 minutes. The glass piece is removed and is washed under running water for several minutes, then rinsed with acetone several times, followed by rinse action with isopropyl alcohol. Finally, it is rinsed several times with DI water and is left to dry on an oven at 90C–100C for 5–10 minutes. It is removed from oven, kept in a dessicator to cool to room temperature and stored in a clean plastic box till further use.

N,N'-diphenyl-N,N'-bis[3methylphenyl]-[1,1'-biphenyl]-4,4'-diamine, also known as TPD is deposited on the cleaned 2"×2" ITO layer using conventional vacuum deposition technique mentioned in U.S. Pat. No. 4,539,507 and incorporated here by reference. Weighed quantity of TPD is placed in a tantalum boat that is heated to just below its melting point (when the TPD powder may seem to form clump) when the pressure reaches about 5–6×10e–6 torr. TPD slowly will evaporate and deposit on the ITO layer. By monitoring the deposition rate of 4–5 A°/sec and upon reaching a thickness of 50 nm the deposition is discontinued by turning down the heat. If the deposition chamber does not have a monitor then TPD rate of deposition will have to be estimated by determining the final TPD thickness for various starting amounts of TPD while maintaining 5–610e–6 torr during the deposition step. Preferred thickness of TPD layer is 50 nm though 25–75 nm may still be effective.

Initially, the deposited thickness for various starting amounts of bisbenzothiazole rigid dye of Example 1 above at 5–6×10e–6 torr is determined using an ellipsometer. The resulting data is used to create a calibration curve to read off starting amount needed to obtain a desired final deposition thickness. Weighed quantity of bisbenzothiazole rigid dye is placed in tantalum boat and heated to a temperature close to melting point and deposited over the TPD layer so that the thickness of the emissive layer obtained is 50 nm. A thickness in the range of 30–70 nm for this emissive material is preferred.

In a manner similar to that for emissive material, a calibration curve for thickness versus starting amount of electron transport material, 2-(4-biphenyl)-5(4-tert-butylphenyl)-1,3,4-oxadiazole (PBD) is determined. From the calibration curve, the amount of starting material that would yield a deposition thickness of 50 nm is estimated. That amount of PBD is weighed in the tantalum boated and PBD deposited on top of the emissive layer.

In much the same way, a calibration curve for cathode material, Aluminium is generated. Using the proper amount of Aluminium estimated from the curve, it is deposited on top of PBD layer using a shadow mask having 4 rows of five 3 mm dia holes to create multiple OLED assemblies. The preferred thickness of Aluminium is 200 nm though a thickness in the range of 100 nm–350 nm is acceptable.

Figure 4:
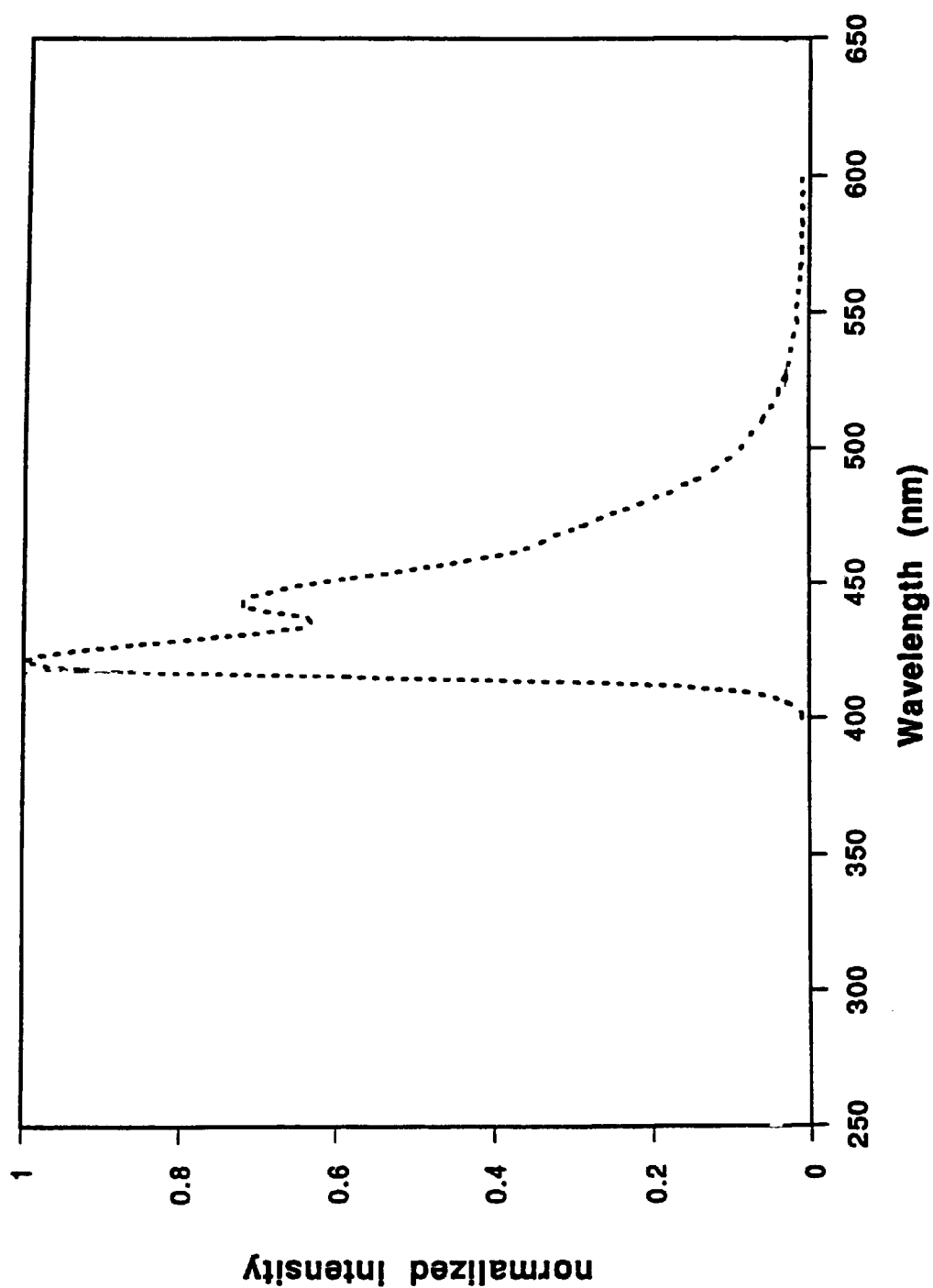
FIG. 4 is the PL spectrum of bisbenzothiazole rigid cyanine dye emitting material. The EL spectrum of device of Example 3 is expected to match the shape shown.
Figure 5:
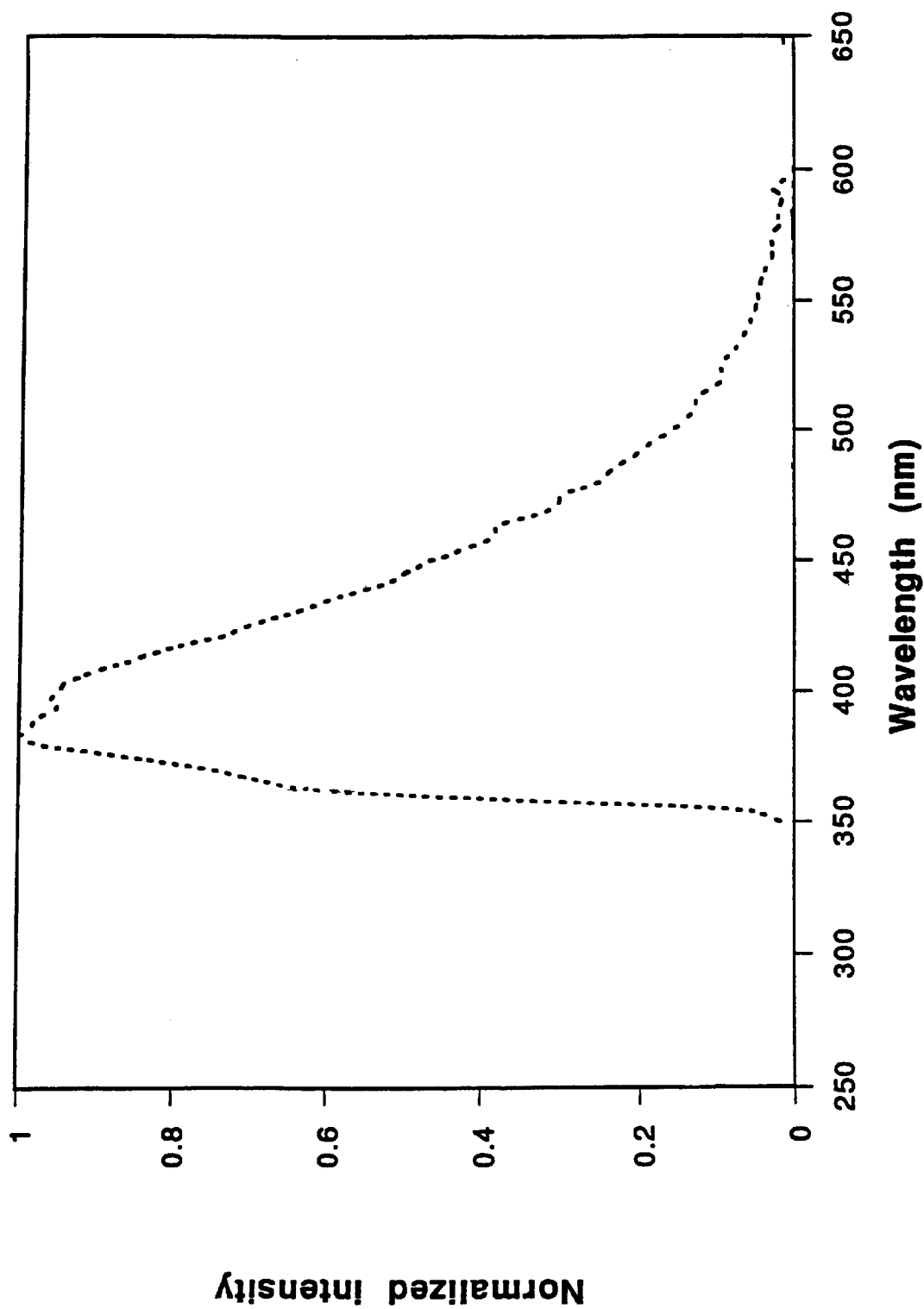
FIG. 5 is the PL spectrum of bisbenzoxazole rigid cyanine dye emitting material. The EL spectrum of device of Example 5 is expected to match the shape shown.

The OLED assembly is tested for electroluminescence in the following manner. In one corner of the 2"×2" glass piece, the organic layers are scraped off with a blade to expose ITO surface. The exposed surface is slightly polished and a landing pad made of solder film is created for pogo pin. The positive pogo pin is adjusted over the solder pad and the negative pogo pin is adjusted over one 3 mm dia Al electrode spot. Upon application of about 25V DC, the blue electroluminescence from emitter layer will be present. Due to slight variation in test conditions, it is likely that onset voltage may vary between 20V–40V. The intensity vs. wavelength of EL spectrum will be similar to the PL spectrum shown in FIG. 4.

Example 4

The two organic layer OLED assembly is constructed as follows:

TPD and bis benzothiazole rigid cyanine dye of Example 1 above are deposited on ITO following the procedure in Example 3. The TPD thickness is kept at 50 nm. However, the thickness of the emissive material is increased to 90 nm. PBD layer is eliminated as the emissive layer is expected to also serve as the electron transport layer. Aluminium is deposited over the emissive layer through a shadow mask such that its thickness is 200 nm though it can vary between 100 nm to 350 nm.

The resulting OLED assembly is tested for EL is same way as Example 3. The onset DC voltage for EL is expected to be about 25V or higher and its the color expected to be blue. Furthermore, the EL spectrum will match the PL spectrum shown in FIG. 4.

Example 5

The single layer organic OLED assembly based on the bisbenzoxazole rigid dye is constructed as follows:

The single organic layer is prepared using spin coating technique. The solution used in spin coating is prepared as follows: 100 mg of poly(N-vinyl carbazole), 40 mg of PBD and 2.0–2.5 mg of bisbenzoxazole rigid cyanine dye are dissolved in 10 ml of chloroform. The resulting solution is spin coated on a clean 2"×2" ITO coated glass at 1000 rpm for 40 sec. This method is similar to that reported in an article in Polym.Prep.,Vol. 41(1), p. 770 (2000) and incorporated herein by reference. The coated layer is dried of solvent traces by baking for 5–7 minutes in an oven at 50C–60C. Aluminium is deposited over the spin coated layer through a shadow mask such that its thickness is 200 nm though it can vary between 100 nm to 350 nm.

The invention has been described in detail with examples and in particular with reference to preferred embodiments thereof. It is understood to those skilled in the art that variation and modification can be made without departing from the spirit and the scope of the invention:

What is claimed is:

1. An electroluminescent device wherein the light emissive layer comprises of organic luminescent material having the structure:

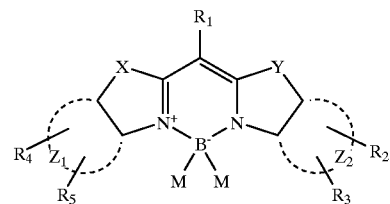

wherein:
X and Y are selected from the group consisting of —C(CH$_3$)$_2$, oxygen, sulfur, —CH=CH—, and N—W—K where N is nitrogen;
dotted lines $Z_1$, and $Z_2$ represent the atoms necessary to complete a structure selected from the group consisting of one ring, two fused rings and three fused rings, each said ring having five or six atoms and each said ring comprising carbon atoms and, optionally no more than two atoms selected from oxygen, nitrogen and sulfur;
$R_1$, $R_2$, $R_3$, $R_4$, $R_5$ are selected from the group consisting of —K and —W—K
M is selected from the group consisting of F and Cl;
B is Boron;
W is a linker selected from the group consisting of branched alkyl chains of 1–27 carbon atoms, straight alkyl chains of 1–27 carbon atoms, monoethers containing 2–20 carbon atoms and polyethers containing 2–20 carbon atoms; and
K is a group conferring desired properties and is selected from the group consisting of:
neutral groups that reduce water solubility selected from the group consisting of hydrogen and halogen atoms;
polar groups that increase water solubility selected from the group consisting of amide, sulfonate, sulfate, phosphate, quaternary ammonium, hydroxyl and phosphonate;
functional groups selected from the group consisting of amino, hydroxyl, sulfhydryl, carboxyl, carbonyl;
reactive groups selected from the group consisting of succinimidyl ester, isothiocyanate, isocyanate, iodoacetamide, maleimide, sulfonyl halide, phosphoramidite, alkylimidate, arylimidate, acid halide, substituted hydrazines, substituted hydroxylamines, carbodiimides; and
electron donating and withdrawing groups that shift absorption and emission wavelengths of the fluorescent molecule;
selected from the group consisting of cyano, nitro, fluoromethyl, amide, nitrophenyl, sulfonamide, alkenyl and alkynyl.
2. A device defined in claim 1 wherein the light emissive layer is deposited by thermal vacuum deposition.

* * * * *